United States Patent
Nam et al.

(10) Patent No.: US 8,053,855 B2
(45) Date of Patent: Nov. 8, 2011

(54) CMOS IMAGE SENSOR FOR PHOTOSENSITIVITY AND BRIGHTNESS RATIO

(75) Inventors: Seung-ho Nam, Seongnam-si (KR);
Jin-hwan Kim, Suwon-si (KR);
Gee-young Sung, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 708 days.

(21) Appl. No.: 11/129,435

(22) Filed: May 16, 2005

(65) Prior Publication Data
US 2005/0253212 A1    Nov. 17, 2005

(30) Foreign Application Priority Data
May 17, 2004  (KR) .................... 10-2004-0034959

(51) Int. Cl.
*H01L 31/0232* (2006.01)
(52) U.S. Cl. ........ 257/432; 257/225; 257/226; 257/227; 257/228; 257/229; 257/230; 257/231; 257/232; 257/233; 257/234; 257/257; 257/258
(58) Field of Classification Search ............... 257/432
See application file for complete search history.

(56) References Cited

U.S. PATENT DOCUMENTS
6,030,852 A * 2/2000 Sano et al. .................... 438/69
6,246,081 B1 6/2001 Abe
2001/0051390 A1 12/2001 Jo
2003/0063204 A1* 4/2003 Suda ........................... 348/272
2006/0113622 A1* 6/2006 Adkisson et al. ............. 257/443

FOREIGN PATENT DOCUMENTS
| JP | 6-163863 | 6/1994 |
| JP | 11-87674 | 3/1999 |
| JP | 11-307748 | 11/1999 |
| JP | 2001-267544 | 9/2001 |
| KR | 1999-013793 | 2/1999 |
| KR | 2002-0058265 | 7/2002 |

* cited by examiner

*Primary Examiner* — Lynne Gurley
*Assistant Examiner* — Hsin-Yi Hsieh
(74) *Attorney, Agent, or Firm* — Sughrue Mion, PLLC

(57) ABSTRACT

A CMOS image sensor for improving light sensitivity and peripheral brightness ratio, and a method for fabricating the same. The CMOS image sensor includes a substrate on which a light sensor and device isolating insulation films are formed, in which the top of the substrate is coated with a plurality of metal layers and oxide films; a plurality of reflective layers formed inside the metal layers, each being spaced apart; a color filter embedded in a groove formed by etching the oxide films inside the reflective layers by a predetermined thickness; a plurality of protrusions formed on both sides of the top of the color filter, each arranged at a predetermined distance from one another; a flat layer formed on the top of the protrusions and the oxide films; and a micro-lens formed on the top of the flat layer. The reflective layer disposed at the top of the photodiode is made of a material having a high reflectance and low absorptivity. Therefore, light incident on the virtual focus plane on the top portion of the reflective layer converges on the photodiode, and thus, the light sensitivity of the sensor is greatly improved.

13 Claims, 7 Drawing Sheets

FIG. 1
(PRIOR ART)
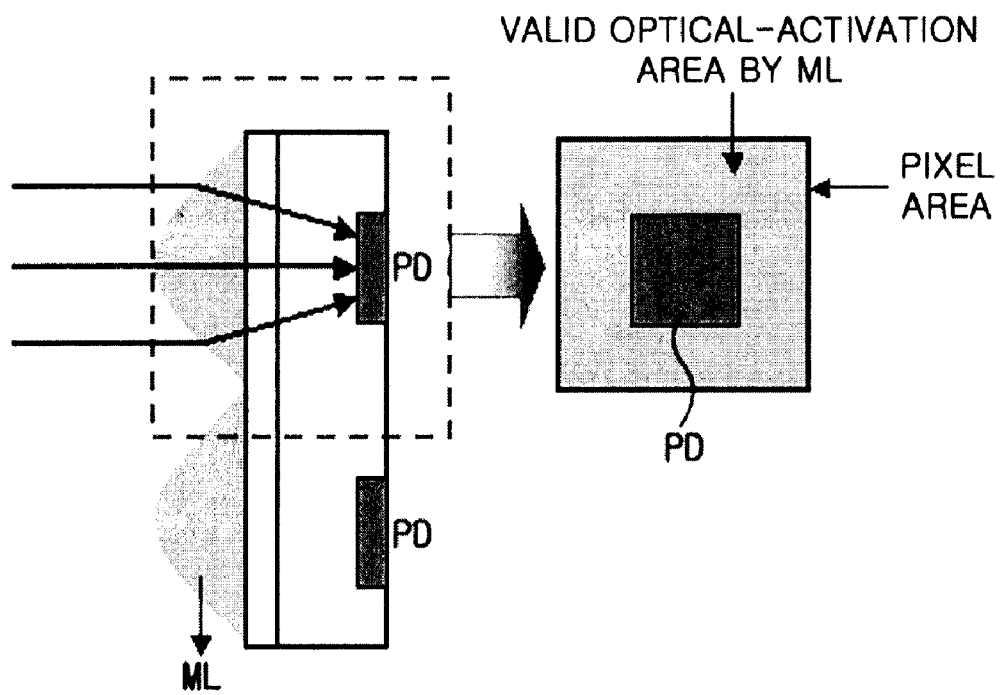
FIG. 2A
(PRIOR ART)
FIG. 2B
(PRIOR ART)
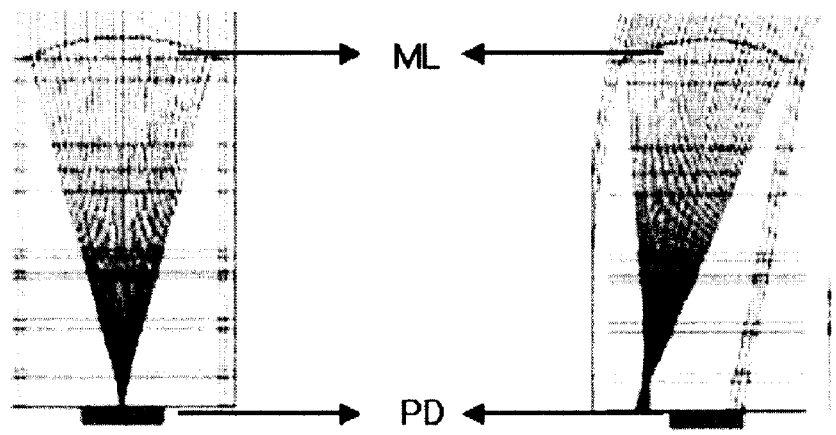

FIG. 3A
(PRIOR ART)
FIG. 3B
(PRIOR ART)
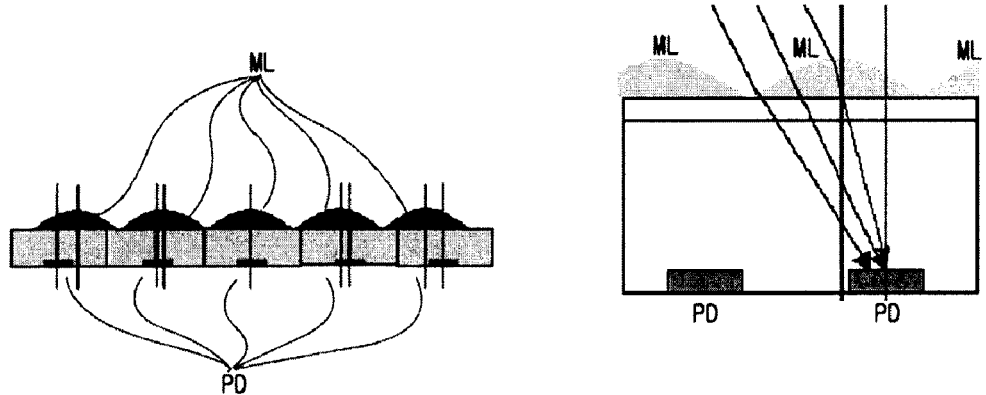
FIG. 4
(PRIOR ART)
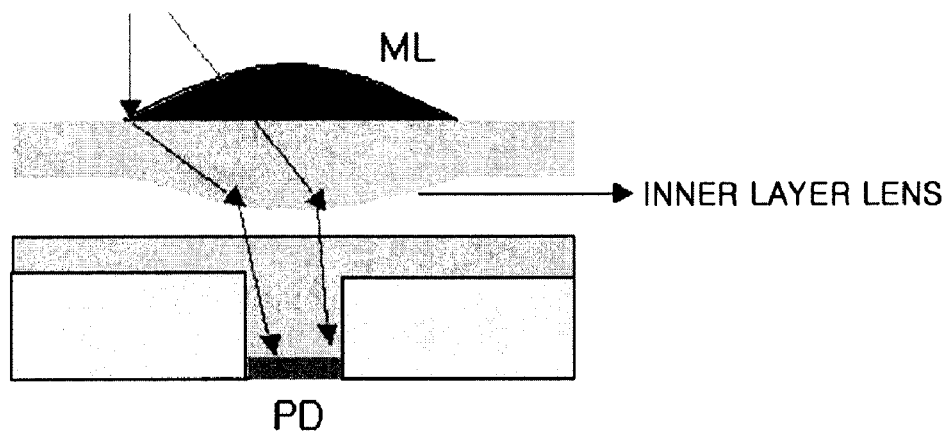

FIG. 5A
(PRIOR ART)
FIG. 5B
(PRIOR ART)
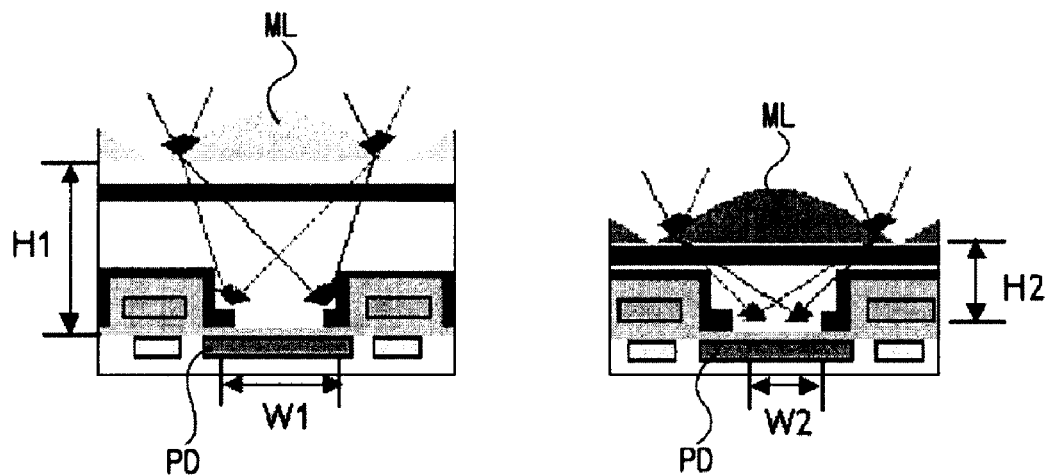
FIG. 5C
(PRIOR ART)
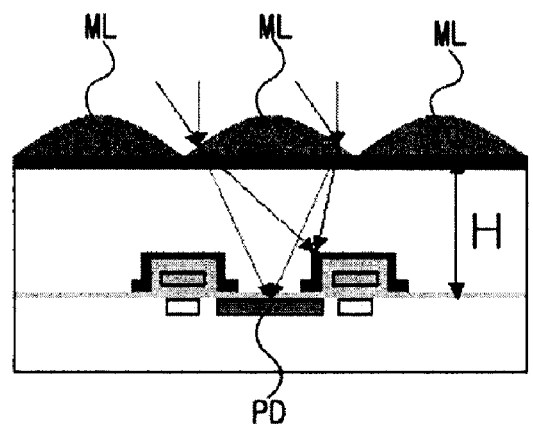

CMOS IMAGE SENSOR FOR PHOTOSENSITIVITY AND BRIGHTNESS RATIO

CROSS-REFERENCE TO RELATED APPLICATIONS

This application claims benefit under 35 U.S.C. §119 from Korean Patent Application No. 2004-34959, filed on May 17, 2004, the entire content of which is incorporated herein by reference.

BACKGROUND OF THE INVENTION

1. Field of the Invention

The present invention relates in general to a high sensitivity complementary metal-oxide semiconductor (CMOS) image sensor and a method for fabricating the same. More particularly, the present invention relates to a CMOS image sensor having excellent photosensitivity and picture quality by gathering a greater amount of light incident outside the sensor to thereby improve its peripheral brightness ratio.

2. Description of the Related Art

In general, an image sensor is a semiconductor device which converts an optical image to an electric signal. There are two types of image sensors: charge coupled devices (CCDs) and complementary metal-oxide semiconductors (CMOS) image sensors.

Particularly, a CCD is a device having closely arranged metal-oxide-silicon (hereinafter referred to as 'MOS') capacitors in which charge carriers are stored respective MOS capacitors and transferred. A CMOS image sensor utilizes CMOS technology employing a control circuit and a signal processing circuit as peripheral circuits for forming as many MOS transistors as the sum of existing pixel numbers in the peripheral circuit. In using these MOS transistors, the CMOS image sensor adopts a switching mode which sequentially senses outputs.

So far, the CCD has been the image sensor receiving the most attention, and it is still used broadly in many applications including digital cameras and camera phones. However, with recent rapid popularization of camera phones, there is a need for low-power consumption. To keep abreast of this trend, investigators have now turned their attention to the CMOS image sensor. This is because the CMOS image sensor can be easily produced using a general CMOS process for fabricating silicon semiconductors, has a small in size and is cost effective, and has low power consumption. Even though it is apparent that the CMOS image sensor is excellent as a portable sensor because of its high degree of integration and low power consumption, the CMOS image sensor has very low photosensitivity compared to a related art CCD. There have been a number of studies which seek to overcome this problem. Meanwhile, another recent tendency is to reduce size of mobile equipment including camera phones. Accordingly, an image optical system housed in a camera phone needs to have a compact size and high picture quality. For example, as the total number of pixels of the CMOS used in a camera phone increases to 300,000, 1 million, 1.3 million, 2 million, 3 million and so forth, the pixel size of a sensor must gradually decrease. Also, the diagonal length of the image sensor must be short if the image module is to have a compact size. Along with these trends, the back focal length is also being made shorter. Because of this, the incident angle of light passing through an edge of the CMOS is getting larger. In other words, the brightness ratio of light incident on the central part to the edge of the CMOS (hereinafter, referred to as a "peripheral brightness ratio") is reduced in proportion to the back focal length of a lens. This phenomenon is observed not only in the CMOS but also in the CCD. In effect, it is one of the largest concerns related to sensors that needs to be resolved.

FIG. 1 is a schematic diagram of an image sensor having an improved photosensitivity disclosed in U.S. Pat. No. 4,667,092. Referring to FIG. 1, to improve the photosensitivity in a related art CCD image sensor, micro lenses ML are deposited on the upper portion of photodiodes PD. In general, the photodiode PD occupies only a certain part of the pixel area of the image sensor. Therefore, the fill factor occupied by the photodiode in the pixel area is less than 1, and accordingly, part of the incident light is inevitably lost. Micro lenses ML are disposed on the upper portion of the photodiodes PD to condense the lost incident light and thus, to increase the quantity of light focused on the photodiodes PD.

FIG. 2 comparatively illustrates a light source that is incident perpendicularly to the sensor of FIG. 1 (FIG. 2A), and an incident light source forming an inclined angle with the sensor of FIG. 1 (FIG. 2B). When the focus position of the micro-lens ML is formed on the photodiode PD, the light incident perpendicularly to the micro-lens ML fully converges on the photodiode PD. However, if the incident light is tilted so that it strikes the micro-lens ML at an angle, a certain deviation length occurs. This phenomenon is observed in light beams incident upon the center and peripheral sides of the sensor, and is a main cause of deterioration of the peripheral brightness ratio of the image sensor. The best-known answer so far to solve the peripheral brightness ratio problem is to reduce the size of the micro-lens.

FIG. 3 is a schematic diagram of an image sensor disclosed in U.S. Pat. No. 5,601,390. Particularly, FIG. 3A illustrates a state in which the optical axes of the micro lenses ML and the optical axes of the photodiodes PD are not coincident, wherein a mask for use in fabricating the micro-lens ML is reduced by a certain ratio. FIG. 3B illustrates a state in which light is incident at a certain angle because of the non-coincident optical axes of the micro-lens ML and the photodiode PD, where the incident light converges on a photodiode PD. In the case of the image sensor illustrated in FIG. 3, the optical axes of the micro-lens ML and the photodiode PD become more distant from each other at the periphery of the sensor than at its center. In this manner, more light can be gathered that is incident at the periphery of the sensor, and the peripheral brightness ratio can be improved. However, there is a fatal flaw in this method. Since the angle of incidence of light entering the center of the sensor is different from the angle of incidence of light entering the periphery of the sensor, if the lenses have the same physical properties, e.g., focal length and lens' diameter, a sufficient quantity of light cannot converge on the photodiode. To solve this problem, in other words, to improve uniformity of light converging on the photodiode (or the peripheral brightness ratio), the micro lenses disposed at the center and the peripheral part of the sensor are designed to have different physical properties. Unfortunately though, a related art fabrication method for the micro-lens, wherein a photoresist (PR) is patterned in rectangular or cylindrical shape and heated to form a micro-lens, cannot meet this requirement.

FIG. 4 is a schematic diagram of an image sensor employing an inner layer lens. As shown in FIG. 4, a light beam that is once converged by a micro-lens ML is converged again by an inner layer lens disposed in the vicinity of a photodiode PD. In this manner, the light gathering efficiency is increased. Particularly, the use of the inner layer lens is very effective for improving the peripheral brightness ratio in that it converges not only a light beam that is incident perpendicularly to the sensor, but also a light beam that is incident at an angle. Because of this merit, an inner layer lens is already employed in many CCD image sensors. Unlike the CCD, however, due to its structure, it is difficult to accommodate an inner layer lens in the CMOS. Even if successful, two or three additional masking steps are required, which increases the cost of manufacturing the CMOS.

FIG. 5 diagrammatically illustrates how the distance between a micro-lens and a photodiode affects the quantity of light incident on the micro-lens at an angle that is gathered by the image sensor. Particularly, FIG. 5A illustrates a case in which the distance H1 between the micro-lens ML and the photodiode PD is relatively long; and FIG. 5B illustrates a case in which the distance H2 between the micro-lens ML and the photodiode PD is relatively short. According to the nature of a lens, if the focal length is long, the focal deviation W1 is increased, while if the focal length is short, the focal deviation W2 is decreased. Because of these characteristics, if the focus of the micro-lens is on a photodiode, the distance between the micro-lens and the photodiode should not be too long because the quantity of light converging on the photodiode is inversely proportional to the distance. Referring to FIG. 5C showing the distance H between the micro-lens ML and the photodiode PD, light beams incident perpendicularly to the micro-lens all converge on the photodiode. On the other hand, light beams incident on the micro-lens at an angle are reflected by a peripheral structure of the photodiode. This phenomenon occurs more often when the distance between the micro-lens and the photodiode is increased, resulting in an increase in focal deviation. Therefore, to improve the peripheral brightness ratio, it is important to minimize the distance between the micro-lens and the photodiode. However, unlike the CCD, structural problems in the CMOS interfere in reducing the distance between the micro-lens and the photodiode.

SUMMARY OF THE INVENTION

It is, therefore, an object of the present invention to provide a CMOS image sensor for improving the photosensitivity and peripheral brightness ratio of the sensor, and for preventing optical cross talk generated by light incident on the sensor at a tilted angle.

To achieve the above objects and advantages, the invention provides a CMOS image sensor including: a semiconductor substrate on which a light sensor and device isolating insulation films are formed, in which the top of the substrate is coated with a plurality of metal layers and oxide films; a plurality of reflective layers formed inside the metal layers, each being spaced apart; a color filter embedded in a groove formed by etching the oxide films inside the reflective layers by a predetermined thickness; a plurality of protrusions formed on both sides of the top of the color filter, each arranged at a predetermined distance from one another; a flat layer formed on the top of the protrusions and the oxide films; and a micro-lens formed on the top of the flat layer.

Preferred embodiments are described below.

The light sensor is a photodiode or a photogate.

The plurality of reflective layers reflect light incident through an opening between the protrusions, to converge the light on the light sensor.

A focus position of the micro-lens is formed on an opening between the protrusions.

A plurality of the protrusions reflect light that has been reflected from the photodiode and the surface of the oxide film due to the difference in refractive indexes of the respective oxide films, to converge the light on the light sensor.

The plurality of protrusions are of equal length, such that an optical axis passing through the opening between the protrusions is coincident with an optical axis passing through a center of the light sensor.

The plurality of protrusions are of different length from one another, such that an optical axis passing through an opening between the protrusions is not coincident with an optical axis passing through a center of the light sensor.

In another aspect, the present invention provides a method for fabricating an image sensor, the method including the steps of: forming a light sensor and device isolating insulation films on a semiconductor substrate; coating the top of the semiconductor substrate with a plurality of metal layers and a plurality of oxide films; forming a plurality of grooves by etching the oxide films inside the metal layer by a predetermined thickness, and coating the grooves with a reflective layer; forming a groove by etching the oxide films inside the reflective layers by a predetermined thickness, and forming a color filter in the groove; forming a plurality of protrusions on both sides of the top of the color filter; forming a flat layer on the top of the protrusions and the oxide films; and forming a micro-lens on the flat layer.

Preferred embodiments are described below.

The light sensor is a photodiode or a photogate.

The plurality of reflective layers reflect light incident through an opening between the protrusions, to converge the light on the light sensor.

A focus position of the micro-lens is formed on the opening between the protrusions.

The plurality of protrusions reflect light that has been reflected from the photodiode and the surface of the oxide film due to a difference in refractive indexes of the respective oxide films, to converge the light on the light sensor.

BRIEF DESCRIPTION OF THE DRAWINGS

The above aspects and features of the present invention will be more apparent by describing certain embodiments of the present invention with reference to the accompanying drawings, in which:

FIG. 1 is a schematic diagram of an image sensor disclosed in U.S. Pat. No. 4,667,902;

FIG. 2 comparatively illustrates a light source that is incident perpendicularly to an image sensor of FIG. 1 (FIG. 2A), and a light source that is incident on an image sensor of FIG. 1 at a tilted angle (FIG. 2B);

FIGS. 3A and 3B are schematic diagrams of an image sensor disclosed in U.S. Pat. No. 5,601,390;

FIG. 4 is a schematic diagram of an image sensor using an inner layer lens;

FIGS. 5A-5C diagrammatically illustrate how the distance between a micro-lens and a photodiode affects the quantity of a light incident on the micro-lens at an angle that is generated by the image sensor;

DETAILED DESCRIPTION OF THE EXEMPLARY EMBODIMENTS

Figure 6A:
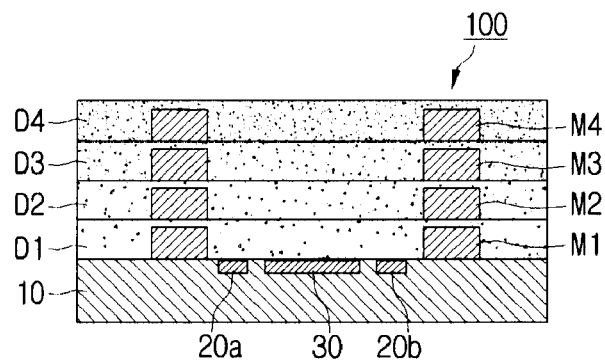
FIGS. 6A to 6H are cross sectional views of a CMOS image sensor of the present invention in different stages of a fabrication process.

An embodiment of the present invention will next be described with reference to the accompanying drawings. However, the present invention should not be construed as being limited thereto.

In the following description, the same drawing reference numerals are used for the same elements even in different drawings. The detailed description below is provided to assist in a comprehensive understanding of the invention. Thus, it is apparent that the present invention can be carried out without being limited to such structure. Also, well-known functions or constructions are not described in detail since they would obscure the invention in unnecessary detail.

FIGS. 6A to 6H are cross sectional views of a CMOS image sensor 100 of the present invention in different stages of a fabrication process.

FIG. 6A is a cross sectional view of a CMOS image sensor 100 right before formation of a color filter. As shown in FIG. 6A, the CMOS image sensor of the present invention includes a photodiode 30 formed as a light receiving device between device isolating insulation films 20a and 20b on substrate 10, and CMOS devices (not shown) with NMOS and PMOS transistors. The CMOS image sensor 100 includes a light sensor for sensing light, and a logic circuit for converting light sensed by the light sensor to an electric signal. Unlike a CCD, the CMOS image sensor is fabricated by processing the light sensor and the logic circuit at the same time. To design and fabricate the logic circuit (not shown), a plurality of metal layers M1-M4, each encompassed by oxide films D1-D4 generated from formation of the logic circuit, are first formed.

Figure 6B:
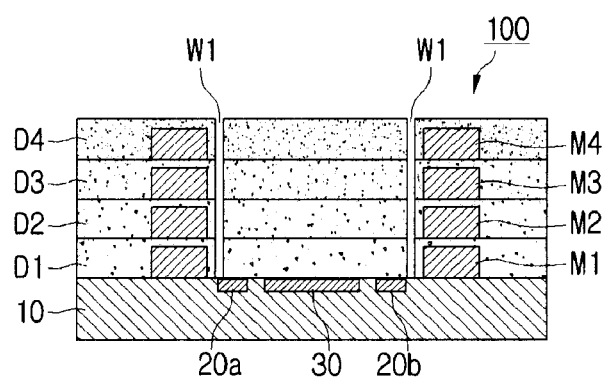

Then, as shown in FIG. 6B, the oxide films D1-D4 are etched from the upper portion of both sides of the photodiode 30, to form a (vertical) groove having a predetermined width W1. If desired, the groove can have a wedge shape, that is, the width W1 can gradually decrease in a top-to-down direction.

Figure 6C:
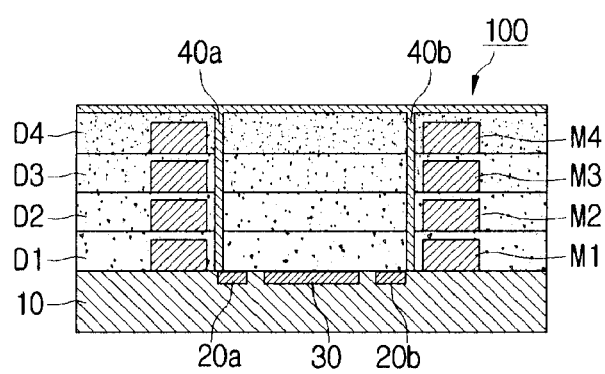

Referring next to FIG. 6C, the groove passing through the oxide films D1-D4 is coated with a reflective layer 40a, 40b by employing a sputtering method. A material having a high reflectance and low absorptivity can be used as a material for the reflective layer 40a, 40b without particular limitation. Examples of the reflective layer-forming material include silicon, titanium (Ti), titanium nitrite (TiN), aluminum (Al), copper (Cu), and tungsten, each having a high reflectance.

Figure 6D:
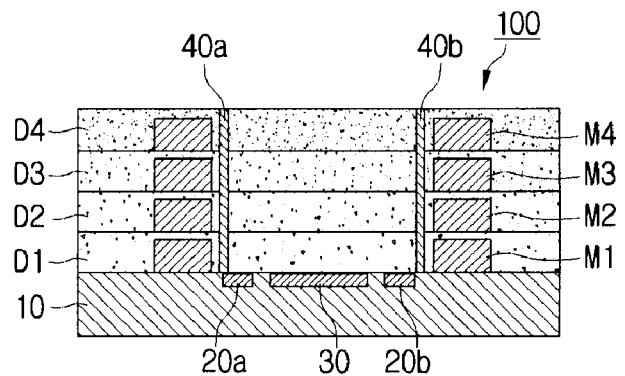
Figure 6E:
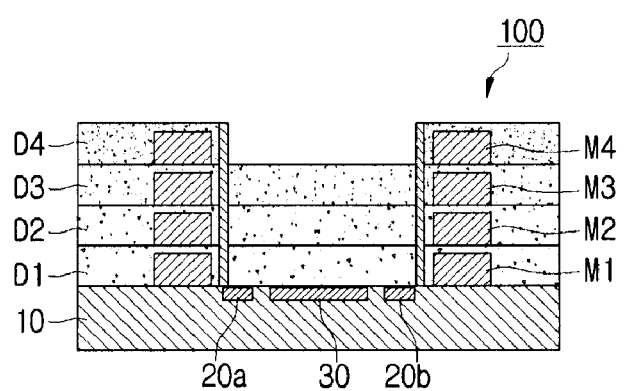
Figure 6F:
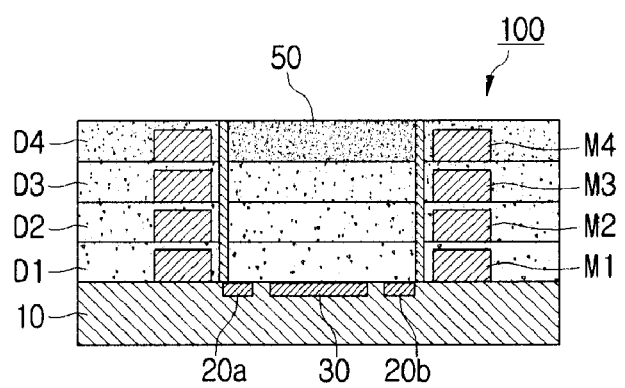

Afterwards, as shown in FIG. 6D, in order to facilitate formation of a color filter, part of the top portion of the fourth oxide film D4 is removed by a predetermined thickness. Also, as shown in FIGS. 6E and 6F, the fourth oxide film D4 within reflective layers 40a, 40b is etched by a predetermined thickness to form a (horizontal) groove, and a color filter 50 is embedded directly in the groove and planarized. The color filter 50 is an array of red (R), green (G) and blue (B) filters. In general, the color filter 50 is formed by adding a dye to a photoresist (PR), and its transmittance is determined according to the amount of dye added to the photoresist (PR). In practice, there is a certain fixed value (or level) for the thickness of the color filter and the amount of dye to be added in order to optimize colors. Thus, it is important to adjust the thickness of the color filter to the fixed level. According to an embodiment of the present invention, the thickness of the color filter may be freely adjusted.

Figure 6G:
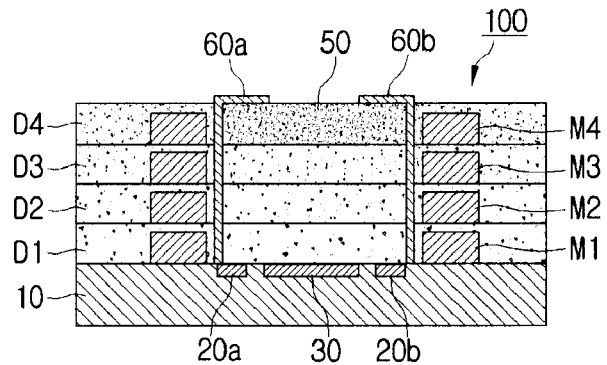
Figure 6H:
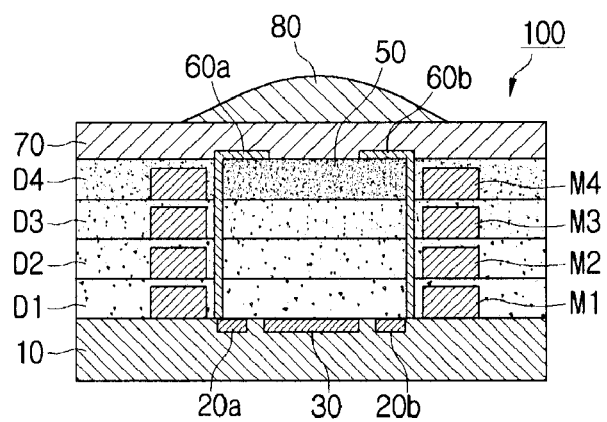

Following formation of the color filter 50, a highly reflective material is deposited on an upper portion of the color filter 50 to form protrusions 60a and 60b as shown in FIG. 6G. Then, as shown in FIG. 6H, a flat layer 70 is formed on the top of the protrusions 60a and 60b, and a micro-lens 80 is formed on the top of the flat layer 70. Preferably, the protrusions 60a and 60b are made of a highly reflective material, such as a metal, but the reflective material is not limited thereto. The center of an opening between protrusions 60a and 60b is usually coincident with the center (i.e., the optical axis) of the photodiode 30, but the present invention also includes a case in which the center of the opening is located outside the sensor, and is not coincident with the optical axis of the photodiode 30. Moreover, the width of the opening can be varied towards the outside of the sensor, and the protrusions 60a and 60b do not necessarily have to be bilaterally symmetrical. Meanwhile, the flat layer 70 is applied to the top of the color filter 50 because the top surface of the color filter 50 is rough.

According to an embodiment of the present invention, the focus position of the micro-lens is formed on the photodiode 30. More specifically, the curvature of the micro-lens 80 and the refractive index of the lens material are adjusted so that micro-lens 80 focuses light on an upper central portion of the color filter. Hereinafter, the focus of the micro-lens 80 on the upper central portion of the color filter will be referred to as a "virtual focus". In accordance with structural characteristics of the present invention, an outer wall portion such as the reflective layers 50a, 50b of the virtual focus is coated with a highly reflective material. Therefore, all light incident on the virtual focus is reflected by the reflective layers 50a, 50b, and eventually converges on the photodiode 30. Also, by disposing the color filter 50 under the protrusions 60a and 60b, the distance between the micro-lens 80 and the virtual focus is minimized. The shorter the focal length of the micro-lens 80, the less the focal deviation on the top surface of the micro-lens 80. In this manner, the peripheral brightness ratio of the sensor can be improved.

Figure 7:
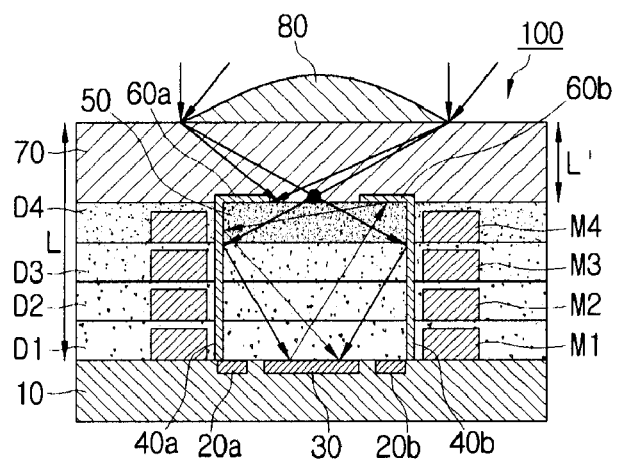
FIG. 7 is a conceptual diagram describing the operation of a CMOS image sensor according to an embodiment of the present invention.

FIG. 7 is a conceptual diagram describing operation of the CMOS image sensor according to an embodiment of the present invention. Referring to FIG. 7, a user adjusts the curvature and refractive index of the micro-lens 80 in order to fix the virtual focus of the micro-lens 80 to the height of the protrusions 60a and 60b. Light beams incident on lower portions of the protrusions 60a and 60b are reflected by the reflective layers 40a, 40b coated with a highly reflective material. Therefore, no matter at what angle a light beam might be incident, it converges on the photodiode 30.

In this manner, the focus position of the micro-lens 80 shifts from the photodiode 30 to the upper central portion of the color filter 50. As seen in FIG. 7, the new focus position L' is much shorter than the old focus position L.

Therefore, the focal deviation on the top surface of the micro-lens 80 with respect to light incident at an angle is extremely small, and this resultantly increases the peripheral brightness ratio of the sensor. Meanwhile, the oxide films D1-D4 of the CMOS image sensor 100 are made of transparent materials, each having a different refractive index. Thus, part of the light incident on the oxide films D1-D4 is reflected from the oxide films D1-D4 due to differences in refractive index, and from the surface of the photodiode 30.

At this time, the protrusions 60a and 60b reflect light that is reflected from the oxide films D1-D4 and the surface of the photodiode 30 back to the photodiode 30, resulting in improved light gathering efficiency of the CMOS image sensor 100.

Figure 8A:
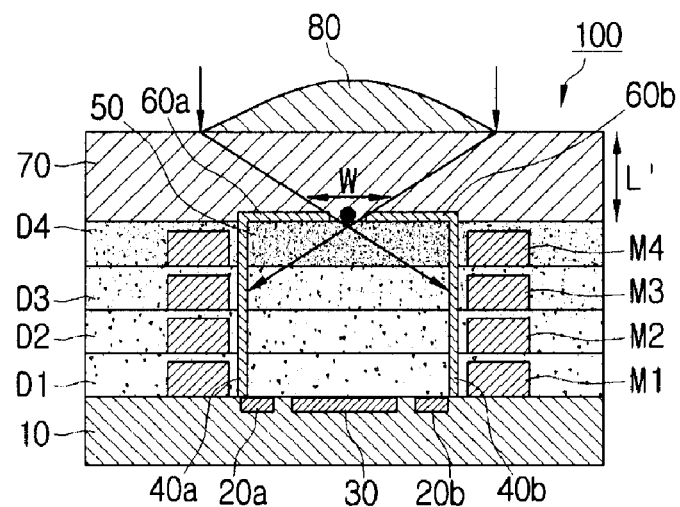
FIGS. 8A and 8B each illustrate a relationship between a photodiode and a central axis of an opening between protrusions.
Figure 8B:
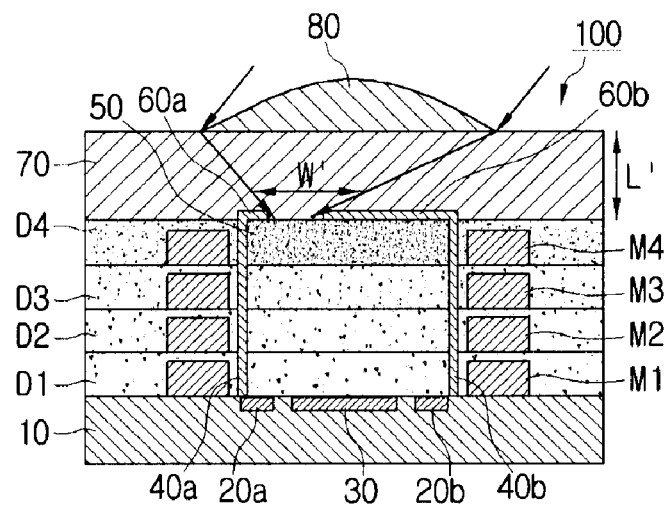

FIGS. 8A and 8B each illustrate a relationship between the photodiode and the central axis of the opening between protrusions.

The roles of the protrusions 60a and 60b are largely divided into two kinds. Firstly, light incident on the opening between the protrusions, i.e., the virtual focus plane, is reflected by the reflective layer 50a, 50b, and converges on the photodiode 30. The protrusions 60a and 60b reduce glare or surface reflection caused by differences in refractive index of the oxide films D1-D4. Secondly, the protrusions 60a and 60b improve the peripheral brightness ratio. In other words, by adjusting the width of the protrusions 60a and 60b and the axis deviation of the photodiode 30, it becomes possible to improve the peripheral brightness ratio due to a difference in the angle of incidence of light on the central part and the peripheral part of the sensor, respectively.

Referring to FIG. 8A, a first protrusion 60a and a second protrusion 60b have the same length with respect to the center of the virtual focus plane. Also, the width W between the protrusions 60a and 60b is small, and the axis of the photodiode 30 and the virtual focus are coincident with one another. On the other hand, the protrusions 60a and 60b shown in FIG. 8B are disposed such that the axis of the photodiode 30 and the virtual focus plane are not coincident with one another. More specifically, the protrusions 60a and 60b are disposed at a peripheral region of the CMOS image sensor 100, and the length of the first protrusion 60a is different from that of the second protrusion 60b. Also, the width W' between the protrusions 60a and 60b is relatively larger than the width W shown in FIG. 8A. Therefore, when forming the protrusions 60a and 60b, the peripheral brightness ratio of the sensor can be improved more effectively without transforming the micro-lens 80, but by simply adjusting the width of the opening and the axes according to the location of the sensor.

Although the above-described embodiments employ a light sensor such as the photodiode, the operation principles are equally applied to an image sensor using other kinds of light sensors including a photogate.

As explained above, the reflective layer disposed at the top portion of the photodiode is made of a material having a high reflectance and low absorptivity. Therefore, light incident on the virtual focus plane on the top of the reflective layer converges on the photodiode, and thus, the light sensitivity of the sensor is greatly improved.

Also, according to an embodiment of the present invention, the focal length of the micro-lens can be reduced and thus, the focal deviation is improved. Thus, it is possible to increase the amount of light converging on the photodiode even if the light is incident on the sensor at an angle. Also, the protrusions formed on both sides of the virtual focus plane reduce the emission of reflective light by the photodiode and the oxide film, so that the amount of light converging on the photodiode is increased. Thus, the light sensitivity of the sensor is improved.

Lastly, the peripheral brightness ratio can be improved by adjusting the width of the opening between the protrusions, and the axis deviation of the photodiode, without transforming the micro-lens.

The foregoing embodiment and advantages are exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A CMOS image sensor comprising:
    a substrate on which a light sensor and device isolating insulation films are formed, in which the top of the substrate is coated with a plurality of metal layers and oxide films;
    a reflective layer which is formed between the metal layers and encloses part of the oxide films;
    a color filter by a predetermined thickness, formed in an interior area enclosed by the reflective layer;
    a protrusion extending from the reflective layer towards a center of an opening on a top surface of the color filter to cover a portion of the top surface of the color filter so that the opening exposing a predetermined area of the top surface of the color filter is formed and light reflected from the light sensor is reflected back to the light sensor by the protrusion;
    a flat layer formed on the top of the protrusion and the oxide films; and
    a micro-lens formed on the top of the flat layer,
    wherein a location and a width of the opening are previously set according to a location of the light sensor, and
    wherein the micro-lens is set to fix a virtual focus of the micro-lens on the top surface of or filter.

2. The CMOS image sensor according to claim 1, wherein the light sensor is a photodiode or a photogate.

3. The CMOS image sensor according to claim 1, wherein the reflective layer reflects light incident through the opening to converge the light on the light sensor.

4. The CMOS image sensor according to claim 1, wherein a focus position of the micro-lens is formed on the opening.

5. The CMOS image sensor according to claim 2, wherein the protrusion reflects light that has been reflected from a surface of one of the oxide films due to a difference in refractive indexes of the respective oxide films, to converge the light on the light sensor.

6. The CMOS image sensor according to claim 1, wherein the location of the opening is at a center of the top surface of the color filter, such that an optical axis passing through the opening is coincident with an optical axis passing through a center of the light sensor.

7. The CMOS image sensor according to claim 1, wherein the location of the opening is not at a center of the top surface of the color filter such that an optical axis passing through the opening between the protrusions is not coincident with an optical axis passing through a center of the light sensor.

8. A CMOS image sensor comprising:
    a substrate having formed on an upper surface thereof a light sensor and first and second device isolating films on opposite sides of the light sensor;
    a stack of oxide films disposed on the upper surface of the substrate and covering the light sensor and device isolating films;
    a plurality of metal layers embedded in the respective oxide films on opposite sides of the light sensor, forming first and second stacks of embedded metal layers, and not covering a projected area of the light sensor;
    a vertically oriented reflected layer formed between opposite sides of the light sensor and the first and second stacks of embedded metal layers;
    a color filter embedded in a horizontally oriented groove of predetermined thickness formed in the stack of oxide films in an interior area enclosed by the reflective layer;
    a protrusion extending from the reflective layer towards a center an opening on a top surface of the color filter to cover the top surface of the color filter so that the opening exposing a predetermined area of the top surface of the color filter is formed and light reflected from the light sensor is reflected back to the light sensor by the protrusion;
    a flat layer formed on the top of the protrusion and the oxide films; and
    a micro-lens formed on the top of the flat layer,
    wherein a location and a width of the opening are previously set according to a location of the light sensor, and wherein the micro-lens is set to fix a virtual focus of the micro-lens on the top surface of the color filter.

9. The CMOS image sensor according to claim 8, wherein the location of the opening is at a center of the top surface of the color filter, such that an optical axis passing through the opening is coincident with an optical axis passing through a center of the light sensor.

10. The CMOS image sensor according to claim 8, wherein the location of the opening is not at a center of the top surface of the color filter, such that an optical axis passing through the opening is not coincident with an optical axis passing through a center of the light sensor.

11. The CMOS image sensor according to claim 1, wherein the protrusion is a reflective protrusion.

12. The CMOS image sensor according to claim 8, wherein the protrusion is a reflective protrusion.

13. The CMOS image sensor according to claim 8, wherein the reflective layer and the protrusion are made of the same reflective materials.

\* \* \* \* \*